United States Patent [19]
Oda

[11] Patent Number: 4,521,797
[45] Date of Patent: Jun. 4, 1985

[54] SEMICONDUCTOR IMAGING DEVICE USING CHARGE-COUPLING DEVICE

[75] Inventor: Eiji Oda, Tokyo, Japan

[73] Assignee: Nippon Electric Co., Ltd., Tokyo, Japan

[21] Appl. No.: 338,362

[22] Filed: Jan. 11, 1982

Related U.S. Application Data

[63] Continuation of Ser. No. 16,358, Feb. 26, 1979, abandoned.

[30] Foreign Application Priority Data

Feb. 27, 1978 [JP] Japan .................................. 53-22668

[51] Int. Cl.³ ...................... H01L 29/78; G11C 19/28
[52] U.S. Cl. ......................................... 357/24; 377/61
[58] Field of Search ................ 357/24 LR, 24 M, 30; 377/57-63; 307/311

[56] References Cited

U.S. PATENT DOCUMENTS

| | | | |
|---|---|---|---|
| 3,856,989 | 12/1974 | Weimer | 357/24 LR |
| 3,896,474 | 7/1975 | Amelio et al. | 357/24 LR |
| 4,155,094 | 5/1979 | Ohba et al. | 357/24 LR |
| 4,242,599 | 12/1980 | Suzuki | 357/24 LR |

OTHER PUBLICATIONS

Sequin, "Interlacing in Charge-Coupled Imaging Devices", IEEE Trans. Electron Devices, vol. ED-20, (6/73), pp. 535-541.
Sequin et al., *Charge Transfer Devices* Academic Press, N.Y. (1975), pp. 152-165.

*Primary Examiner*—Gene M. Munson
*Attorney, Agent, or Firm*—Laff, Whitesel, Conte & Saret

[57] ABSTRACT

A two-dimensional, imaging device has a semiconductor substrate of one conductivity type, an orthogonal array of photosensitive regions of opposite conductivity type, charge transfer gates and charge transfer channels separating columns of the orthogonal array. A gate pulse generator applies a gate pulse to the charge transfer gates. A clock pulse generator applies a two phase clock to the charge transfer channels. The charge transfer channels include electrode pairs, each of which is formed by a charge storage electrode and a potential barrier electrode which are arranged so that a charge storage electrode of one pair is connected to a potential barrier electrode of an adjacent pair, to receive the same clock pulse.

7 Claims, 10 Drawing Figures

SEMICONDUCTOR IMAGING DEVICE USING CHARGE-COUPLING DEVICE

This is a continuation of application Ser. No. 016,358, filed Feb. 26, 1979 (now abandoned).

This invention relates to a structure of a two-dimensional imaging device using a charge transfer device, and a method for driving the imaging device.

Charge transfer devices are roughly classified into a charge-coupled device (hereinafter referred to as a "CCD") and a bucket brigade device (hereinafter referred to as a "BBD"). In this specification, a two-dimensional image device using a CCD will be referred to, and the subject matter of this invention may also be applied to the device where BBD is employed.

The technique of using a CCD has shown a marked progress, since the concept thereof became known in 1970, by utilization of a highly progressive semiconductor integrated circuit technique, and has found various applications, such as a solid image device, an analogue delay line, a filter and a digital memory. Particularly, the CCD solid image device has the features of a low power consumption, reduced size and weight, and freedom from lag. In addition, it is advantageously high in S/N and in integration density, as compared with a prior art MOS type image device.

A new solid image device recently has been developed, in which photoelectric conversion regions are formed by P-N junctions. These CCD devices are used as shift registers for reading out a photoelectrically converted signal charge. Such a solid image device has the combined features of a conventional MOS type solid image device and a CCD solid image device, thus presenting a high photosensitivity and a high S/N ratio.

The conventional device, in which this type image device is employed for the two-dimensional imaging, results in a complicated structure. A difficulty has been confronted in providing a device suited for realizing an interlaced scanning, in order to prevent the flicker of an image which is experienced upon a reproduction of an image.

Some of the conventional solid image devices which are suitable for the interlaced scanning are shown by Carlo H. Sequin in "IEEE Transactions on Electron Devices" Vol. ED-20, No. 6, pages 535 to 541 which was published on June 1973. The first type of such a device is the line addressed imaging device in which a set of linear imaging structures are arranged so that each one corresponds to a scan line in the display. Every other such device is driven at one time period to readout a shift register at one time in order to convert the charges accumulated therein into electrical signals. Other devices are driven at the next time. to form an interlaced picture on the display. In this type of device, the shift gate wiring structure is very complicated for driving every other linear imaging structures.

The second type of image devices has an imaging area arranged as a set of linear imaging CCD structures, a first storage area for storing the charges shifted from the imaging area, a first readout shift register for shifting to a charge detector the charges shifted from the first storage area, a second storage area and a second readout shift registor. The accumulated charges in the imaging area are shifted to the first storage area. Then every other charge is shifted to the first readout shift registor to be converted into the corresponding electrical signals, but the other charges are shifted to the second storage area. After all of the other charges are converted into electrical signals, the other charges stored in the second storage are then shifted to the second readout shift registor to be converted into the electrical signals. This second type of device has disadvantages since it requires a large occupying area and since the first readout shift register contains a highly complex electrode arrangement.

The third type of image devices has a construction such that, at one time period, every other charge accumulated in first imaging areas are used to produce electrical signals but the other charges are discarded in second areas. At the next time period, the other charges in the second areas are used to produce electrical signals, but the charges in the first areas are discarded. This type of image device has an inferior light sensitivity, because one-half of each accumulated charge is discarded.

It is accordingly an object of the present invention to provide a new two-dimensional image device free of the above-described drawbacks, and a method for driving the device.

To attain the object, there is provided according to the present invention provides a two-dimensional image device, which includes plurality of, mutually isolated, photo-sensitive regions formed on a semiconductor substrate of one conductivity type. The photo-sensitive regions are semiconductor regions of an opposite conductivity type. Gate electrodes, in desired numbers, are positioned adjacent the photo-sensitive regions. Charge shift channels are provided adjacent the gate electrodes, in opposed relation to the photo-sensitive regions. These charge shift channels have their own electrodes. The photo-sensitive regions are two-dimensionally arranged so that rows and columns may be formed. The two-dimensional image device are characterized in that the charge transfer structure underneath gate electrodes and at least part of regions of the charge shift channels adjacent the gate electrodes are formed as surface channels, having conduction channels at the surface regions of the semiconductor substrate. The other regions of the charge shift channels are formed as buried channels having conduction channels in the semiconductor substrate. Each of the charge shift electrodes has two or more parts for applying the clock pulses. The adjacent two or more parts of the charge shift electrodes receive the opposite clock pulses. Each of the photo-sensitivity regions is electrically isolated from the adjacent photo-sensitivity regions and from the adjacent photo-sensitivity regions positioning opposite to the gate electrode.

According to the present invention, a method of driving a two-dimensional image device is characterized in that signal charges accumulated in the photo-sensitive regions read out by two phase clock pulses and gate pulses. A gate pulse has a first voltage of a polarity capable of producing conductive channels underneath gate electrodes adjacent to said photo-sensitive regions and is applied to the gate electrodes in synchronism with first clock pulses, for transferring; the charges accumulated in every other photo-sensitive region the charge shift channel. Then, the charges are shifted along the charge shift channel and converted into a series of electrical signals in order to form a half of a picture on a display. After this step the gate pulse having a second voltage of the same polarity as first voltage is applied to charge the shift electrodes in synchronism with second clock pulse in order to transfer the charges accumulated in the other photo-sensitive regions to the charge shift channel. The charges are shifted along the charge shift channel and converted into a series of electrical signals for forming another half of a picture. At the charge accumulating time period, no gate pulse is applied to the charge transfer electrodes which to separate each of the photo-sensitive regions from the other and from the charge shift channel.

According to the present invention, the CCD imaging device requires no additional area for temporary storage of a charge. Further, because the interlaced scanning is achieved by synchronization of the gate pulse and the clock pulses, no complicated wiring arrangement is needed for the charge shift channel. The charge accumulation period is not shortened caused by as the second type of the prior art. As a result, there is no loss of light sensitivity.

The above and further objects, features and advantages of the present invention will become more apparent from the following detailed description of embodiments taken in conjunction with the accompanying drawings, wherein.

Figure 2:
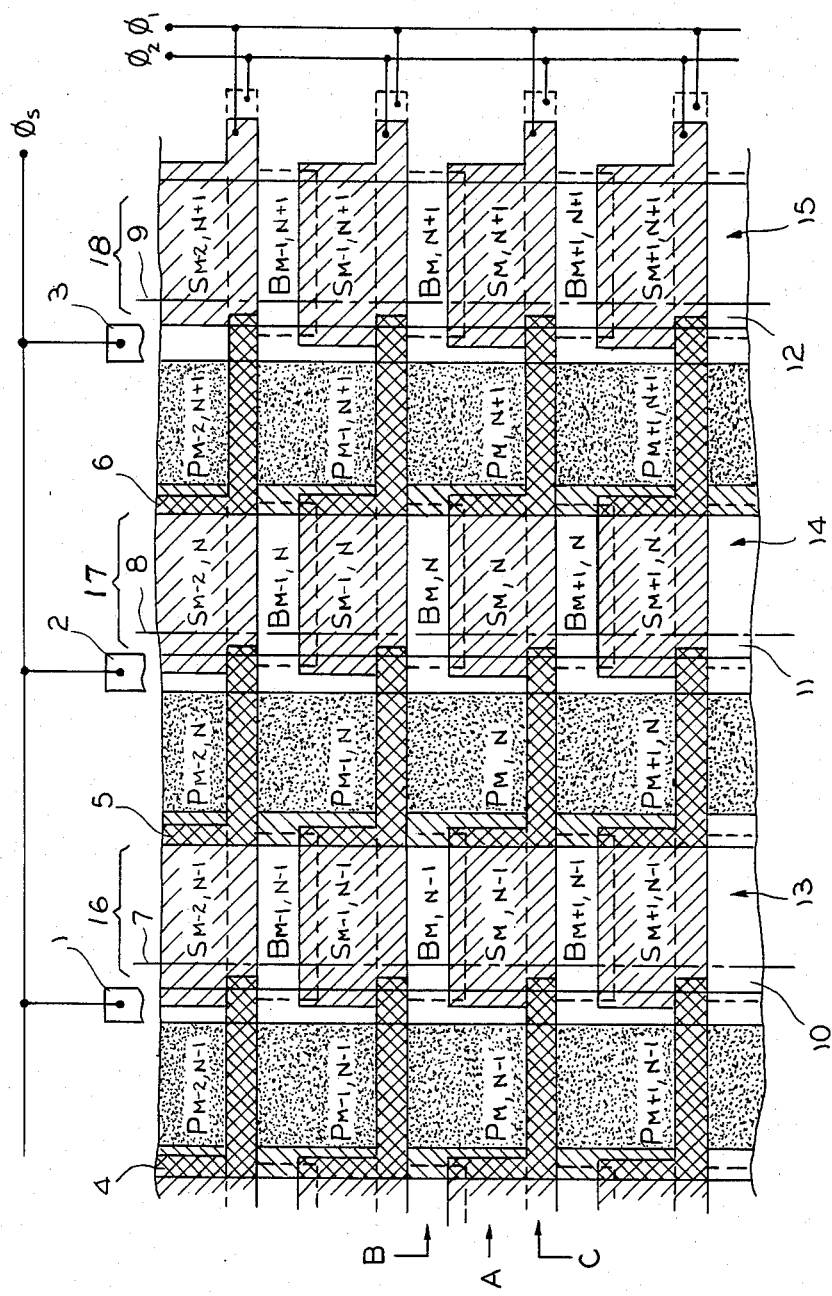
FIG. 2 is a plan view of the essential part of a CCD image device according to a first embodiment of the present invention.
Figure 3:
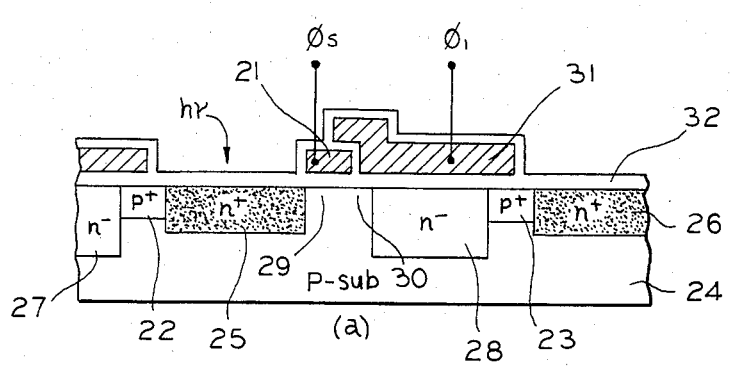
Figure 3:
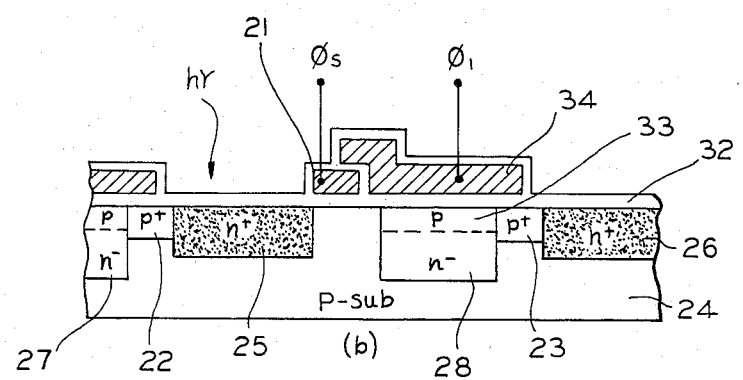
Figure 3:
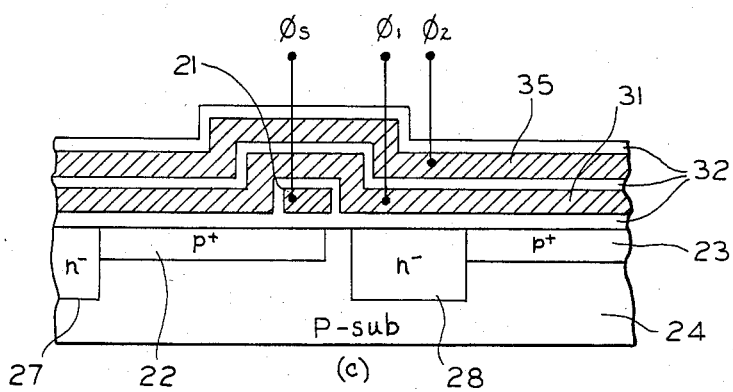
Figure 4:
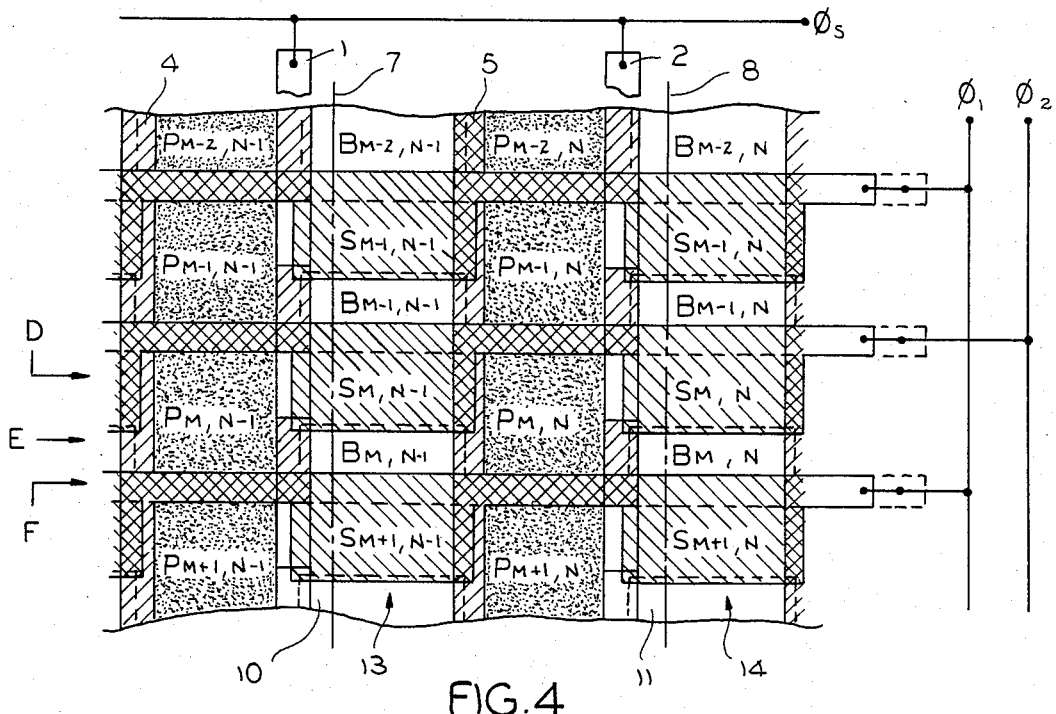
Figure 5:
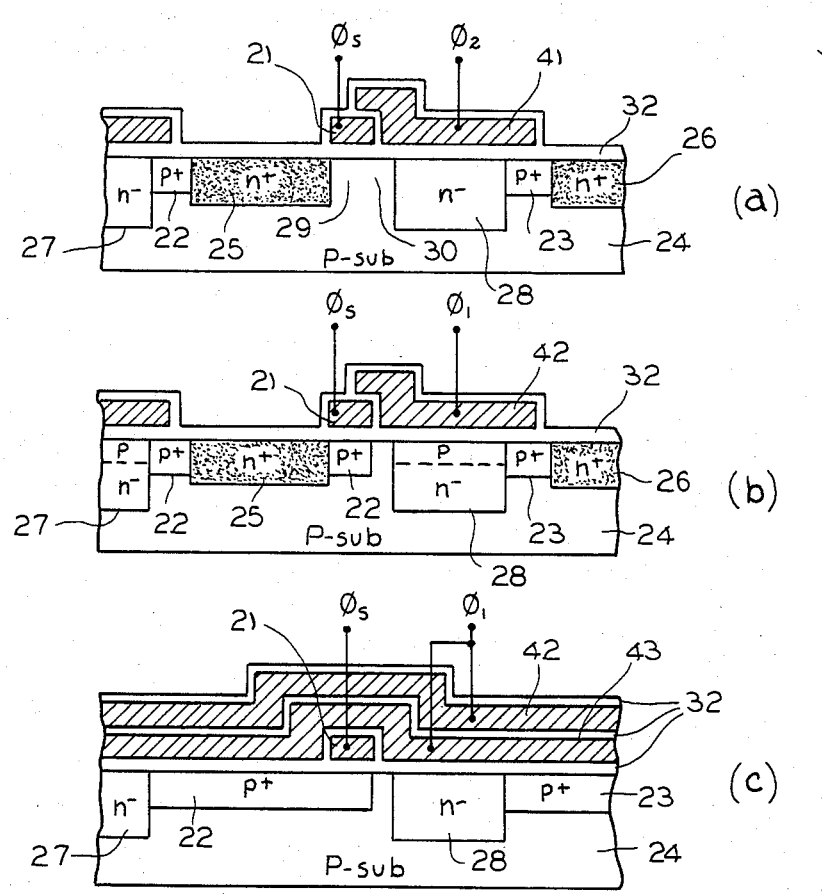

FIGS. 3(a), (b) and (c) show fragmentary cross sections of the device, as viewed in the directions of arrows A, B and C in FIG. 2, respectively;

FIG. 4 is a plan view of the essential part of a CCD image device according to a second embodiment of the present invention; and, FIGS. 5(a), (b) and (c) show fragmentary cross sections of the image device, as viewed in the directions of arrows D, E and F in FIG. 4, respectively.

Figure 1:
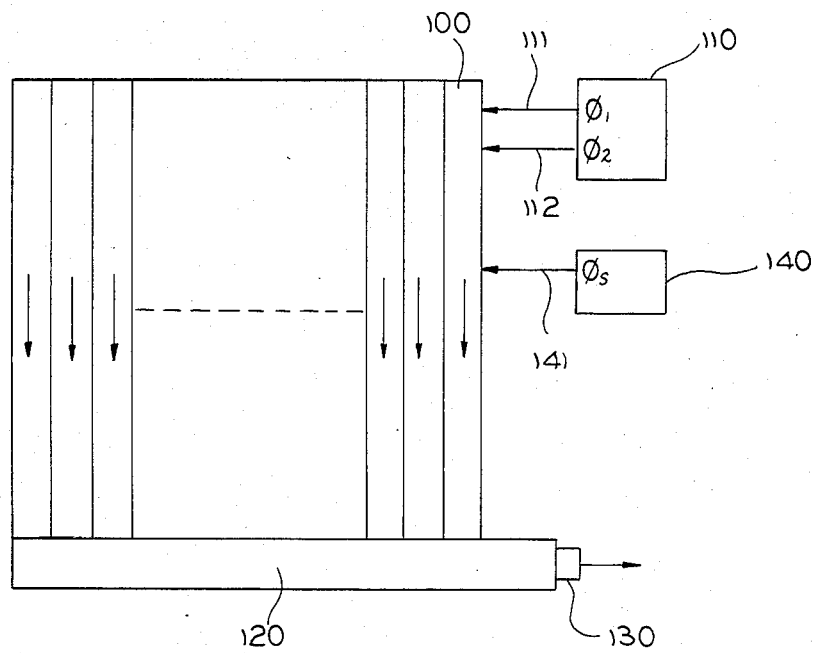
FIG. 1(a) is a block diagram of a CCD image sensor employing a CCD imaging device according to the present invention and FIG. 1(b) is a timing chart showing the relation of clock pulses $\phi_1$ and $\phi_2$ and a transfer gate pulse $\phi_s$.
Figure 1:
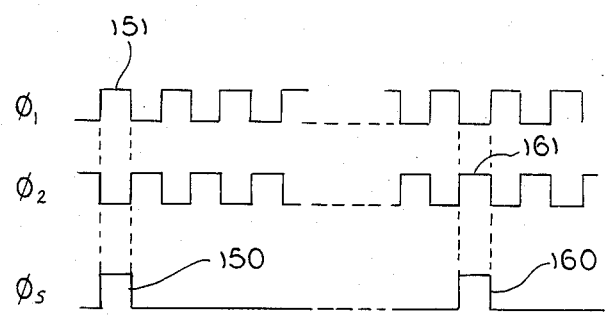

In FIG. 1(a), the CCD image sensor employs a CCD imaging device 100 according to the present invention. This CCD imaging device 100 has many photo-sensitive regions orthogonally arranged in two dimensions so that rows and columns may be formed. The charges are accumulated in the photo-sensitive regions in response to the irradiated light intensity. At the time of and even number field scanning period, the charges accumulated in every other photo-sensitive region in every column are transferred to a shift channel disposed in parallel to each column. Transfer occurs responsive to a transfer gate pulse $\phi_s$ generated in generator 140, and applied through wiring 141. The transferred charges are shifted along the columns of photo-sensitive regions (as shown by arrows) to the readout shift register 120 responsive to clock pulses $\phi_1$ and $\phi_2$ generated in generator 110 and applied through wirings 111 and 112. The relation of the transfer gate pulse $\phi_s$ and the clock pulses $\phi_1$ and $\phi_2$ is shown in FIG. 1(b). At this scanning period, the transfer gate pulses $\phi_s$ (150) is in synchronism with the clock pulse $\phi_1$ (151), and during the term after the clock pulse $\phi_1$ (151), the charges transferred to the shift channels are shifted along the columns.

The charges reach the readout shift register 120 and are then shifted along the register 120 to the charge detector 130 in order to produce a series of electrical signals responsive to clock pulses having a faster repetition cycle than that of clock pulses $\phi_1$ and $\phi_2$.

At the following time when odd numbered fields are scanned the charges accumulated in the other photo-sensitive regions are transferred to the shift channel responsive to the transfer gate pulse $\phi_s$(160) which rises in synchronism with the second clock pulse $\phi_2$. These transferred charges are shifted along the columns of the photo-sensitive regions by the clock pulses $\phi_1$ and $\phi_2$ after the transfer gate pulse $\phi_s$ (160) disappears. The charges reach to the readout shift register 120 and are then shifted along the register 120 to the charge detector 130, which produces a series of electrical signals that are delivered from the charge detector 130.

FIGS. 2, 3(a), 3(b) and 3(c) illustrate a first embodiment of a CCD image device according to the invention. In FIG. 2, the reference symbols $\overline{P\ M-2, N-1}$, $\overline{P\ M-1, N-1}$, ... $\overline{P\ M+1, N+1}$ identify photo-sensitive regions, which correspond to n+ type regions 25 and 26 in FIGS. 3(a), to 3(c). Each region has an area of $10\mu \times 10\mu$, an impurity concentration of $10^{15} \sim 10^{21}$ cm$^{-3}$, and a depth of 1 to $2\mu$. The n+ semiconductor regions 25 and 26 are formed in a p type silicon substrate 24 having an impurity concentration of $10^{14} \sim 10^{15}$ cm$^{-3}$. These photo-sensitive regions are electrically isolated from one another by means of channel stoppers 4 through 6. These channel stoppers 4 through 6 are p+ type regions 22 and 23 in FIGS. 3(a) to 3(c) which have an impurity concentration of $10^{17} \sim 10^{18}$ cm$^{-3}$.

Charge transfer channels 16, 17 and 18 are formed parallel to the corresponding columns of the photo-sensitive regions. Charge transfer channels in the N column (N=1, 2, ...) and the adjacent photo-sensitive regions in the N+1 column are electrically isolated from one another by means of channel stoppers 4, 5 and 6. Each of these respective charge transfer channels include a surface channel portion in a regions 10, 11 and 12 adjacent to gate electrode 1, 2 or 3 and a buried channel portions in a regions 13, 14 and 15. Shown at 7 through 9 are lines which define the boundaries between the surface channel portions 10 through 12 and the buried channel portions 13 through 15, respectively. Denoted by S M-2, N-1, ... S M+1, N+1 are charge storage regions of shift gates in a two-phase driving CCD. Denoted by B M-2, N-1, ... B M+1, N+1 are potential barrier regions of shift gates. One shift gate has one charge storage region and one potential barrier region to achieve a two-phase clock drive. Gate electrodes 1 through 3, adjacent the lines of photo-sensitive regions, are connected to apply transfer pulses $\phi_s$.

In the arrangement according to the present invention, a couple of the potential barrier region and charge storage region is adjacent to a corresponding one photo-sensitive region, through one gate electrode. In more detail, the potential barrier portion $\overline{B\ M, N}$ and charge storage portion $\overline{S\ M, N}$ are positioned opposite the photo-sensitive region $\overline{P\ M, N}$, and connected to receive a first clock pulse $\phi_1$. The potential barrier portions B M-1, N and B M+1, N and the charge storage portions S M-1, N, P M+1, N, are positioned opposite to the photo-sensitive regions P M-1, N, P M+1, N, respectively, and connected to received a second clock pulse $\phi_1$. In the arrangement according to the present invention, charge storage portions S M-1, N-1, S M-1, N and SM-1, N+1 located in the M-1 row and potential barrier portions P M+1, N-1, B M+1, N and BM+1, N+1 located in the M+1 row are electrically isolated from the photo-sensitive regions PM, N-1, PM,N and PM, NH located in the M row by means of channel stoppers 4, 5 and 6, respectively.

FIGS. 3(a), 3(b) and 3(c), show at 21 is a gate electrode adjacent to photo-sensitive region 25; at 31 an electrode on the charge storage portion; at 34 an electrode on the potential barrier portion; and at 35 a wiring for introducing a second clock pulse $\phi_2$. The first clock pulse $\phi_1$ is applied to the electrodes 31 and 34, by wiring. These electrodes 21, 31 and 34 and wiring 35 are polysilicon. The electrodes 21, 31 and 34 are isolated from each other by silicon dixoide layers 32. Channel stoppers 22 and 23 are formed for electrically isolating between the photo-sensitive regions 25 and 26 and N$^-$ type regions 27 and 28 in the charge transfer channel. The N$^-$ type regions 27 and 28 form a buried channel type shift register with the P type substrate 24 and electrodes 31 and 34, and have an impurity concentration of $10^{16}$ cm$^{-3}$. At regions in the N$^-$ type regions 27 and 28, underneath the electrode 34, P type regions 33 are formed to produce a potential barrier by implanting the impurity ions by a dose of $8 \times 10^{11}$ cm$^{-2}$. While the thickness of the silicon dioxide layer 32 at the charge transfer channel is designed 300~1000 Å to secure the production of a channel, the thickness of the silicon dioxide layer 32 at the photo-sensitive regions 25 and 26 is 5000~6000 Å to pass a light h$\nu$ having a predetermined wave length.

The operation of the device according to the first embodiment of the present invention will be described next. This description will be given with reference to the N-channel element alone. However it will be readily understood by those skilled in the art that the principle of the operation according to the present invention may also be applicable to a P-channel element, if the type of conduction of the semiconductor and the polarity of voltage to are applied be reversed. First, the photo-sensitive regions 25 and 26 corresponding to the regions P M−2, N−1, . . . P M+1, N+1 are biased to a positive potential as compared with the substrate 24. At this time, part of electrons which are the majority carriers in the n+ regions 25 and 26 are swept to the outside of the device through the charge transfer channels 16, 17 and 18. Depletion layer capacities are produced between both the regions 25 and 26 and the substrate 24. Then to the gate electrodes 21 or 1 to 3, a voltage is applied which should not be high enough to produce a conductive channel thereunder. Photo-sensitive regions 25 and 26 float electrically and are electrically isolated from the other parts of the device.

Under this situation, irradiation of incident light onto the photo-sensitive regions 25 and 26 will produce electron-hole pairs in the regions 25 and 26. Only the electrons will be accumulated by a value corresponding to the irradiated light intensity in the N-side of the aforementioned P-N junction capacity, namely on the side of the regions 25 and 26.

At the following time period, the accumulated charge must be read out and converted into a series of electrical signals for reproducing a picture on a display. This process is classified into two processing periods, one is even-numbered field scanning periods and the other is odd numbered field scanning periods. First, at an even-numbered field scanning period, a high positive voltage is applied to gate electrodes 1, and 3, or 21, and the first clock pulse $\phi_1$ is of high positive voltage is applied to the shifts electrodes 31 and 36. As a result, charges accumulated in every other photo-sensitive regions $P_{M-2, N-1}$, $P_{M, N-1}$, $P_{M-2, N}$, $P_{M, \overline{N}}$ $P_{M-2, N+1}$ and $P_{M, N+1}$ (FIG. 2) are transferred to the corresponding charge storage portions S$M-2$, N−1, SM, N−1, SM−2, N, SM, N, SM−2, N+1, and SM, N+1 of the charge shift channel. During the period the second clock pulse $\phi_2$ is held at low potential voltage.

In more detail, the value of the voltage (high positive voltage) should be high enough to produce conductive surface channels the regions underneath gate electrodes 1 through 3. For example, these surface channels are produced on the semiconductor regions 29, or on the semiconductor regions located in the regions 10 through 12 (FIG. 2). The regions 10, 11 and 12 contain region 29 underneath the gate electrodes 21 and part 30 underneath the charge shift electrodes connected to apply the first or second clock pulses $\phi_1$ or $\phi_2$. The value of the low potential voltage should not be high enough as to produce any conductive channel on regions 10 through 12. By applying voltage of the aforementioned levels to respective electrodes, electrons which are signal charges will be transferred from the photo-sensitive regions located in the M−2 and M rows through the region underneath gate electrodes 1 through 3 to the charge storage regions in the M−2 and M rows. In this case, signal charges accumulated in the photo-sensitive regions in the M−1 and M+1 rows can not be transferred to the corresponding charge storage regions, because no conductive channel is produced in the regions located underneath the charge shift electrodes by the second clock pulse $\phi_2$. Such regions act as potential barriers. Further, the photo-sensitive regions. P $\overline{M}$, N located in the M row and N column and the charge storage region S $\overline{M-1, N}$ located in the M−1 row and N column are isolated from each other by means of channel stopper 5 as well as by the surface channel region in which no conductive channel is formed. Hence, there is no likelihood of a signal charge in the region P $\overline{M, N}$ being transfered to region S $\overline{M-1, N}$ Region P $\overline{M, N}$ and potential barrier region B $\overline{M+1, N}$ located in the M+1 row and N column are also isolated from each other by means of channel stropper 5. Hence, there is no likelihood of a transfer of charge from P $\overline{M, N}$ to B $\overline{M+1, N}$. The transfer of signal charger from P $\overline{M, N}$ to $\overline{S M, N}$ is thus ensured.

By the operations so far described, the signal charges accumulated in every other photo-sensitive region will be transferred to the charge shift channels. Subsequently, the aforesaid low level voltage will be applied to gate electrodes 1 through 3 or 21, and the signal charges are sifted along the charge shift channels to read out the corresponding electric signals. The reading out of a signal charge for each of the even numbered fields is thus completed.

Next, the reading out of the signal charge for the odd-numbered of field will start. The high level voltage is applied to the charge transfer gate electrodes 1 through 3 in synchronism with the first clock pulse $\phi_1$ of low-level voltage and the second clock pulse $\phi_2$ of high-level voltage. The charges accumulated in the other photo-sensitive regions $P_{M-1, N+1}$, $P_{M+1, N-1}$, $P_{M-1, N}$, $P_{M+1, N}$—are transferred to the corresponding charge store region $S_{M-1, N-1}$$S_{M+1, N-1}$, $S_{M-1, N}$, $S_{M+1, N}$—in the charge shift channel, through resions the surface channel 10, 11—12. Then the transferred charges are shifted along the charge shift channel for reading out electrical signals.

It is apparent from the foregoing that, according to the present invention, a two-dimensional image device is easily realized, in which charge transfer channels are two-phase driven and interlaced scanning is accomplished.

According to the first embodiment, the charge transfer between the photo-sensitive region and the charge shift channel is made by the surface channel type transfer gate, resulting in perfect isolation during the charge accumulating period and charge shift period. The charge shift along the charge shift channel is made by the buried channel type CCD shift register, resulting in high transfer efficiency. Because the shift electrode corresponding to the respective photo-sensitive regions consists of one potential barrier electrode and one charge shift electrode to which the same clock pulse is applied, the shift channel is operated by two phase clocking, resulting in simple clock generator. This imaging device occupies areas only for the photo-sensitive regions, the charge transfer regions and the charge shift regions therefore, a savings in area is achieved. The photo-sensitive regions accumulate charges in the read-out period of the other field, in order to provide long accumulating period which insures a high light sensitivity. In addition, this embodiment has an in advantage that the imaging device can be manufactured by the conventional semiconductor technique, because there is no complicated construction.

FIGS. 4, 5(a), 5(b) and 5(c) show a second embodiment of the present invention, wherein FIG. 4 is a plan view of the essential part of the device, and FIGS. 5(a), 5(b) and 5(c) illustrate fragmentary cross sections as viewed in the directions of arrows D,E and of F of FIG. 4, respectively. The components similar to those in FIGS. 2, 3(a), 3(b) and 3(c) are identified by reference numerals common to FIGS. 2, 3(a), 3(b) and 3(c). Shown at 41 through 43 are charge shift electrodes, wherein electrode 41 is connected to apply second pulse $\phi 2$ and electrodes 42 and 43 are connected to the first clock pulse $\phi 1$.

In the arrangement of this embodiment, potential barrier regions B $\overline{M, N-1}$ ... are adjacent, by way of transfer gate electrodes 1, 2 and 3 or 21, to photo-sensitive regions P $\overline{M, N-1}$ ... located in the M row are covered with charge shift electrode 42 connected to apply the first clock pulse $\phi_1$. Charge storage regions S $\overline{M, N-1}$ ... are adjacent, by way of the transfer gate electrodes 1, 2 and 3 or 21, to the photo-sensitive regions. These charge storage regions are covered with charge shift electrodes 41 connected to apply the second clock pulse $\phi_2$. The photo-sensitive regions located in the M row are isolated by means of channel stoppers 22 from the aforesaid potential barrier regions. The potential barrier regions in the M−1 row and the charge storage regions located in the M+1 row are electrically isolated by means of channel stoppers 22 from the photo-sensitive regions located in the M row.

The device of the second embodiment differs in structure from that of the first embodiment in that: the photo-sensitive region and the potential barrier regions which are located in the same row and the same column are isolated from each other by means of the channel stoppers; charge shift electrodes covering the charge storage regions in the M row and the potential barrier region in the M−1 row form a pair and are commonly connected to receive the same clock pulse; and charge shift electrodes 42 and 43 which are placed in the form of multiple layers on the channel stoppers, as seen in FIG. 5(c), are connected to received the same clock pulse phase.

In operation, taking as an example the photo-sensitive regions located in the M row and N column, the accumulated signal charge in the photo-sensitive region PM, N is transfered to the charge shift channels, when voltage of a high level $\phi_s$ is applied to the transfer gate electrode 1, 2 and 3, the second clock pulse is at a high level, and the first clock pulse $\phi_1$ is at a low level. By channel stopper 5 and surface channel region 11, the photo-sensitive region PM, N is isolated from the potential barrier region BM, N or the charge storage region SM+1, N. By the same reason, the photo-sensative region PM, N is isolated from the potential barrier region BM−1, N or the charge storage region SM−1, N, thus ensuring a transfer of the signal charge from the photo-sensitive region PM, N to the charge storage region SM, N. Other operations are quite the same as those in the first embodiment. Thus, a two-dimensional image device is easily provided, which is two-phase driven and permits the interlaced scanning.

What is claimed is:

1. A two-dimensional, imaging device comprising a semiconductor substrate of one conductivity type, an orthogonal array of photosensitive regions of an opposite conductivity type formed on said semiconductor substrate, charge transfer channels separating columns of said orthogonal array, gate means also separating columns of said photosensitive regions for enabling a transfer of light-caused charges from said photosensitive region to said charge transfer channels, each of said charge transfer channels including electrodes for charge storage regions and electrodes for potential barrier regions, these two type of electrodes being disposed on but electrically isolated from the semiconductor substrate of said one conductivity type to form buried channel charge coupled devices, one pair of said two types of electrodes being disposed beside one photosensitive region and electrically isolated from each other, another pair of said two types of electrodes adjacent said one pair of two type electrodes being disposed beside another photosensitive region adjacent to said one photosensitive region in the same column of said orthogonal array and electrically isolated from each other, said electrode for the charge storage region of said one pair and said electrode for a potential barrier region of said other pair being electrically connected with each other, means for applying a combination of gate pulses to said gate electrodes and two phases of clock pulses to said charge shift electrodes for transferring charges from said photosensitive areas to said charge transfer channels, and means for alternately applying the two phases of the clock pulses to said charge shift electrodes for shifting the transferred charges along said columns.

2. The device of claim 1 further comprising charge to signal conversion means disposed at an end of said columns for converting light-induced charges originating in said photosensitive regions and transferred though said charge transfer channels into electrical signals.

3. The device of claim 1 further comprises means for applying one of said phases of clock pulses to every other pair of said two type of electrodes while the other phase of said clock pulses is being applied to the other pairs of said two type of electrodes.

4. The device of claim 1 further comprising isolation regions formed in said substrate to stop electrical interchange between adjacent photosensitive regions.

5. A two-dimensional image device comprising a plurality of, mutually isolated, photosensitive regions formed on a semiconductor substrate of one conductivity type, said photosensitive regions accumulating charges in response to irradiated light and being two-dimensionally arranged in rows and columns; transfer gate electrodes formed adjacent to and in parallel with said columns of said photosensitive regions; and charge shift channels adjacent to and in parallel with said transfer gate electrodes, said charge shift channels having a number of charge shift electrodes corresponding to the number of photosensitive regions; said image device being characterized in that:

a. each of said charge shift electrodes includes a charge storage part and a potential barrier part;

(b) said transfer gate electrodes being disposed on but electrically isolated from a semiconductor region of said one conductivity type to form surface channel charge coupled devices to enable a transfer of accumulated charges from said photosensitive regions to said charge shift channels, and said charge storage parts and said potential barrier parts of said charge shift electrodes being disposed on but isolated from a semiconductor region of the other conductivity type to form a buried channel charge coupled device to enable a shift of the transfer charges along said charge shift channels;

c. one pair of said charge storage part and said potential barrier part of said charge shift electrode facing one of said photosensitive regions and being isolated from each other, and an adjacent pair formed by said charge storage part and said potential barrier part facing an adjacent one of the photosensitive regions in each column and being isolated from each other;

d. said charge storage part belonging to said one pair of said charge shift electrodes being electrically connected with said potential barrier part belonging to said adjacent pair of said charge shift electrodes;

e. said one photosensitive region being electrically isolated from said adjacent photosensitive region; and f. accumulated charges being transferred from said one photosensitive region to the charge storage part of said one pair facing said one photosensitive region, and from said adjacent photosensitive region to the charge storage part of said adjacent pair facing said adjacent photosensitive region.

6. The two-dimensional image device as defined in claim 5, wherein the potential barrier part of said one pair and the charge storage part of said adjacent pair is connected to receive first clock pulses, and the potential barrier part of said adjacent pair and the charge storage part of said one pair is connected to receive second clock pulses, the phases of said first and second clock pulses being different from each other.

7. The device of claim 5 wherein said conversion means includes a shift register for transferring the charges transferred from said charge transfer channel, and a charge detector positioning at an end of said shift register.

* * * * *